United States Patent [19]

Mueller

[11] Patent Number: 4,697,058

[45] Date of Patent: Sep. 29, 1987

[54] MICROWELD APPARATUS WITH AN IMPROVED ELECTRODE TIP DESIGN AND TIP SUPPORT

[75] Inventor: Wolfgang F. Mueller, Wappingers Falls, N.Y.

[73] Assignee: International Business Machines Corporation, Armonk, N.Y.

[21] Appl. No.: 856,514

[22] Filed: Apr. 28, 1986

[51] Int. Cl.⁴ .............................................. B23K 11/32
[52] U.S. Cl. ................................ 219/56.21; 219/56.22
[58] Field of Search .................. 219/56.1, 56.21, 56.22

[56] References Cited

U.S. PATENT DOCUMENTS

| | | | |
|---|---|---|---|
| 3,263,059 | 11/1963 | Rzant | 219/91 |
| 3,775,579 | 11/1973 | Burghart et al. | 219/56.22 |
| 4,171,477 | 10/1979 | Funari | 219/56 |

OTHER PUBLICATIONS

IBM TDB, Dec. 1982, p. 3591.
IBM TDB, Jun. 1983, p. 240.
IBM TDB, Feb. 1984, p. 4747.
IBM TDB, Nov. 1985, p. 2641.

Primary Examiner—Clifford C. Shaw
Attorney, Agent, or Firm—Wolmar J. Stoffel

[57] ABSTRACT

A welding apparatus for bonding small wires to a metal surface wherein an electric current is passed through a portion of a wire in contact with a welding tip, the apparatus having a welding tip support means for supporting the welding tip for rectilinear movement, the support means having movable mass less than 10 grams, the low mass enabling the welding tip to maintain contact with the wire portion during the molten phase of the wire during the welding operation, and a means to urge the tip support means into engagement with the wire.

19 Claims, 13 Drawing Figures

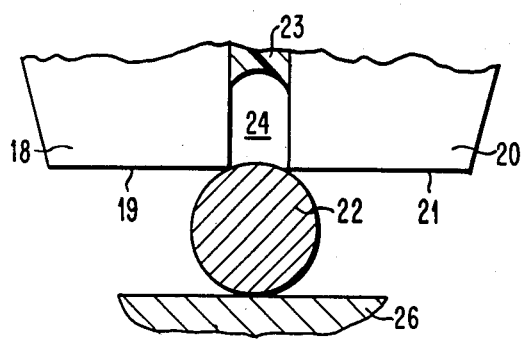 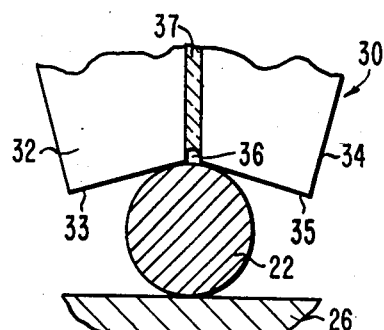
FIG. 5A PRIOR ART    FIG. 6A
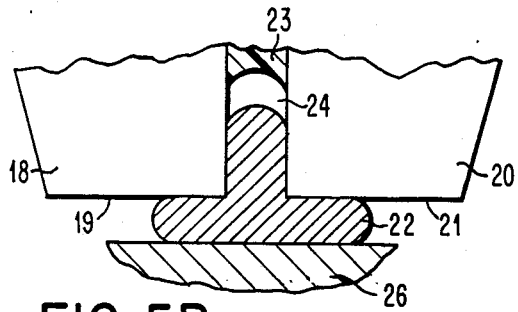 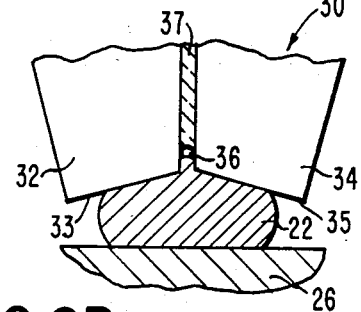
FIG. 5B PRIOR ART    FIG. 6B
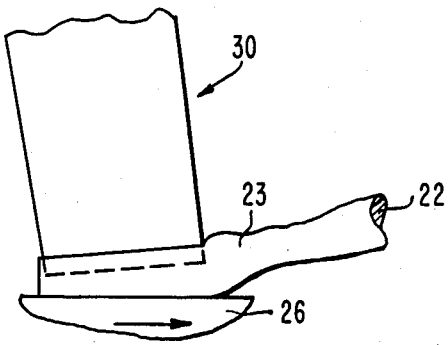
FIG. 7
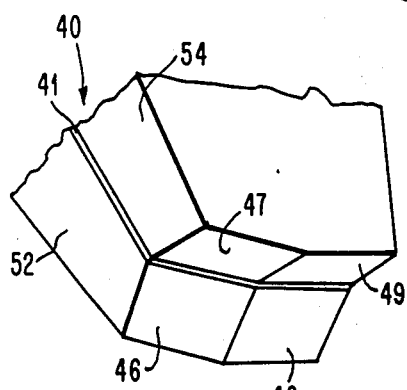 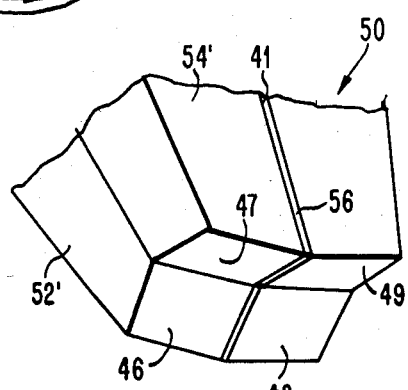
FIG. 8    FIG. 9

MICROWELD APPARATUS WITH AN IMPROVED ELECTRODE TIP DESIGN AND TIP SUPPORT

BACKGROUND OF INVENTION

This invention relates generally to bonding wires, more particularly, the welding of very fine wires to metal surfaces. More specifically, the invention is directed to an improved microwelding apparatus and process for joining very fine wires with diameters less than 3 mils to terminals of electronic elements.

Electronic packaging of integrated circuit semiconductor devices has become increasingly more microminiaturized and has placed greater demands on the circuit joining technology involved. Terminals on integrated circuit devices that may number in the hundreds must be joined to metallurgy pads on supporting substrates. Also, the substrates of the packages have become increasingly more complex, often supporting as many as 130 integrated semiconductor devices and making the necessary circuit interconnection wiring. In view of the complexity and high cost of the substrate, it is frequently necessary to make engineering changes in the circuitry and also correct for defects in the interconnection metallurgy. The connections necessary to implement these objectives can be conveniently made using very fine wires bonded to selected pads on the device and/or substrate.

The most common fine wire bonding technique is called ultrasonic bonding. In this process the end of the wire to be bonded is positioned under a bonding tip by means of a wire guide hole in the tip. A load is exerted on the tip which causes the wire to be forced against the substrate land or against the chip pad. A horizontal cyclic displacement of the tip relative to the substrate is produced at an ultrasonic frequency for a predetermined length of time. This ultrasonic motion scrubs the wire-land interface surfaces, fragmenting oxide films and any other films to produce a clean-metal-to-clean-metal contact at the interface surfaces and produces a shallow room temperature diffusion and alloying of the surface metals. This results in a metallic bond between the wire and the land or pad. It is believed that the frictional heat developed by the ultrasonic motion at the interface surfaces probably results in diffusion occurring at somewhat higher than room temperature.

The ultrasonic bonding technique has a major disadvantage which is very significant, particularly when used to make changes or correct for defects in the metallurgy system of a multilayer ceramic (MLC) substrate, of the type described and claimed in U.S. Pat. No. 4,245,273. The ultrasonic bonding technique requires that the bonding pad or surface be formed of a heavy gold layer with a thickness of at least 10 micron. In the fabrication of such MLC substrates, this heavy gold layer can only be deposited by electroplating. This requires a series of additional steps which increase the cost, as well as subjects the substrate to additional environments which reduce the yield.

It is known that fine wires can be bonded by microwelding techniques as disclosed in U.S. Pat. No. 4,171,477. In this technique a pair of electrodes which are electrically isolated from each other are positioned over a wire in contact with a metal surface. A voltage source applies a voltage between the electrodes which causes a current to flow through the tips and through a very short segment of the wire in contact with the electrodes. This produces a momentary heating of the wire so that it melts and fuses a wire segment to the metal surface. This type of bond does not require the heavy gold layer that is necessary in ultrasonic bonding. However, the resultant welds vary in quality and strength, and the welding tips have a relatively short life.

SUMMARY OF THE INVENTION

An object of this invention is to provide an improved microwelding apparatus and microwelding method that consistently produces superior welded joints between a fine wire and a metal surface.

Another object of this invention is to provide an improved microwelding apparatus having a new welding tip that has an extended useful life.

In accordance with the aforementioned objectives of the invention, there is provided a microwelding apparatus for bonding wires with a diameter less than 3 mil to a conductive metal surface wherein an electric current is passed through a portion of the wire in contact with the welding tip, a support means for supporting the welding tip for rectilinear vertical movement wherein the support means has a movable mass less than 10 grams which is thereby capable of the rapid movement necessary to maintain the electrical contact between the welding tip and the surface of the wire during the molten phase of the wire during the welding operation, and the means to urge the welding tip support means into engagement with the wire on the metal surface.

BRIEF DESCRIPTION OF THE DRAWINGS

FIGS. 5A and 5B are highly magnified views in cross-section of a bonding tip and wire and the pad before and after the weld has been formed by the technique and apparatus known in the prior art.

FIGS. 6A and 6B are highly magnified views in cross-section of a bonding tip, wire and pad before and after the weld has been formed by the technique and apparatus of the invention.

FIG. 7 is a side elevational view of a welding tip and a wire after it has been bonded.

FIG. 8 is a perspective view of a preferred specific embodiment of a welding tip of the invention.

FIG. 9 is a perspective view of another preferred specific embodiment of a welding tip of the invention.

DESCRIPTION OF PREFERRED EMBODIMENTS

Figure 1:
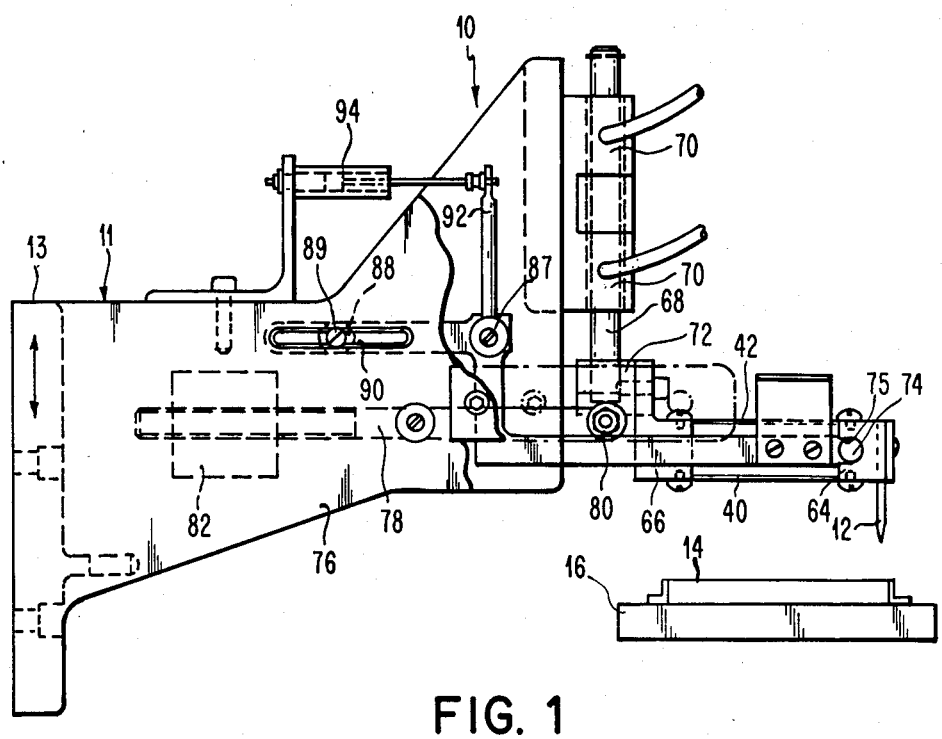
FIG. 1 is a side elevational view in broken section of a preferred specific embodiment of the welding apparatus of the invention.
Figure 2:
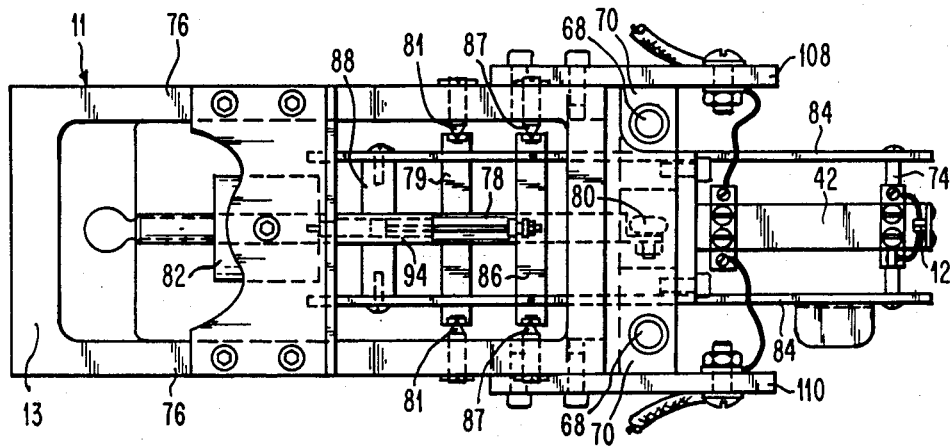
FIG. 2 is a top plan view of the welding apparatus of the invention illustrated in FIG. 1.

Referring now to FIGS. 1 and 2 of the drawings, there is illustrated the welding assembly 10 of the invention mounted for vertical movement on a frame, not shown. The assembly 10 has mounted thereon a welding tip 12 located over a substrate 14, in turn supported on a movable stage 16. Stage 16 is capable of moving substrate 14 in both the X and Y directions to allow the welding tip 12 to be located on any spot thereon.

The objective of welding assembly 10 is to precisely support the welding tip 12 over the wire to be welded and having the capability of varying the tip pressure on the wire, and also to provide an initial greater pressure to partially deform the wire to establish and initiate a good electrical contact with the wire. An important objective is providing the tip support element with a low mass so that when the wire becomes molten and starts to withdraw from the tip surface, the tip will have the capability of following the wire surface to maintain the electrical contact thereby avoiding arcing. Arcing of the current results in loss of control and producing non-uniform and potentially defective welds.

The welding assembly 10 includes a frame 11 consisting of a mounting block 13 and two attached side members 76. The welding tip 12 is mounted in a tip support block 64 or made of a dielectric or insulating material. Block 64 is attached to two parallel spring leaf elements 40 and 42. The opposite ends of springs 40 and 42 are attached to a spring mount block 66 also made of electrically insulating material. Block 66 is attached to a cross member 72 in turn attached to two vertical alignment shafts 68 slideably mounted in air-bearings 70. Thus, the welding tip and the associated aforedescribed elements are vertically movable as a unit in bearings 70. The leaf springs 40 and 42 will flex during operation allowing independent movement of tip support block 64. The total mass of the welding tip and block 64 is very low allowing it to follow the movement of the wire surface as the wire becomes molten and partially collapses during the welding.

Figure 10:
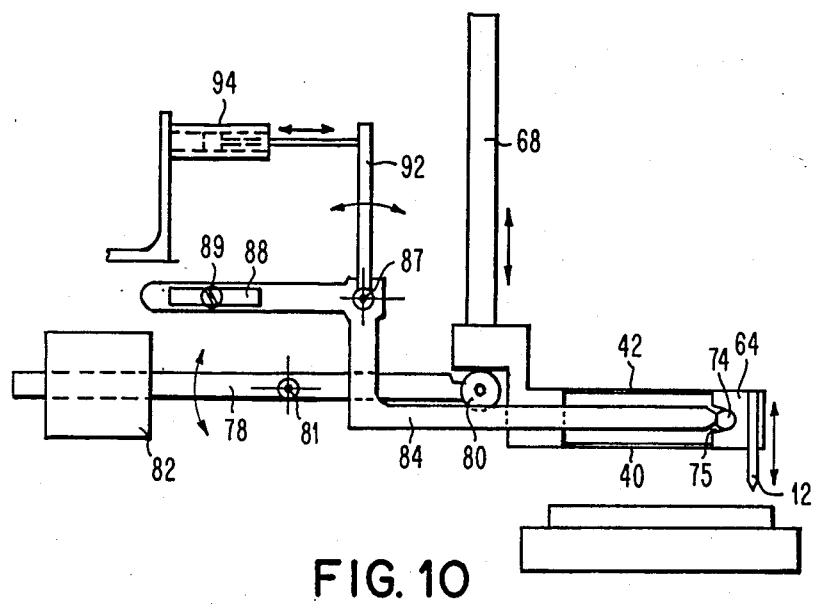
FIG. 10 is a schematic elevational view of the pivoted, and slidable elements without the frame members that partially obscured the elements.

The loading, i.e., the pressure applied by the welding tip against the wire being welded, is controlled by pivoted balance bar 78, most clearly shown in FIG. 10. Bar 78 is supported by cross bar 79 that is pivotally mounted on bearings 81 mounted on frame 11. Roller 80, on one end of bar 78, abuts the bottom of cross member 72, providing an upward force on the welding tip support mechanism. A weight 82 is adjustably mounted on the opposite end of bar 78 providing a means of varying the upper force supplied to the cross member 72.

A mechanism is provided to apply initially force tip 12 against the wire being bonded to partially deform it prior to welding. The deformation increases the surface area contact between the wire and the welding tip and thus improve the electrical contact. The mechanisms consists of two parallel lever elements 84 shown schematically in FIG. 10. The lever elements 84 are supported on a pivoted cross member 86, in turn pivotally supported on a bearings 87. On one end of levers 84 is a balance weight 88 that is adjustable. Adjustment of weight 88 is accomplished by loosing screws 89 through slots 90 in the frame and moving the weight relative to the pivoted cross member 86. The opposite ends of lever elements 84 are joined by a cross bar 74 seated in slot 75 in tip support block 64. An arm 92 is provided which extends upwardly from cross member 86. An air cylinder 94 is mounted to apply an adjustable force on arm 92 which is applied to welding tip 12 through levers 84. Thus the initial deformation force on the wire is applied by cylinder 94.

Figure 11:
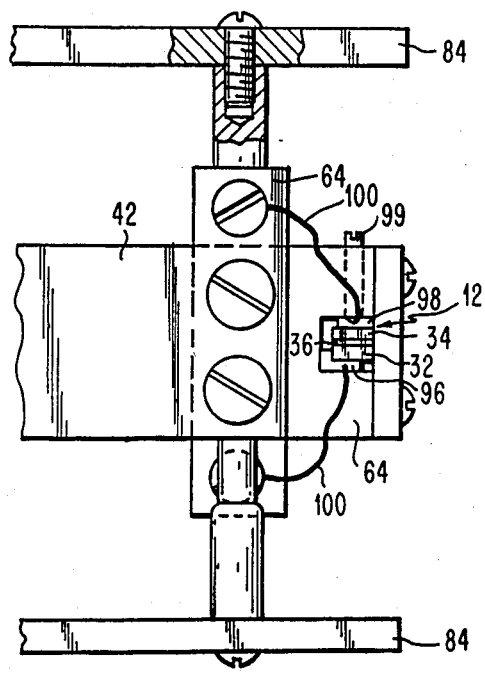
FIG. 11 is a top plan view, in greatly enlarged scale of the structure that supports the welding tip.

An electrical current for producing a weld is applied to welding tip 12 across the tip elements 32 and 34, separated by dielectric layer 36 as indicated in FIG. 11.

Figure 4:
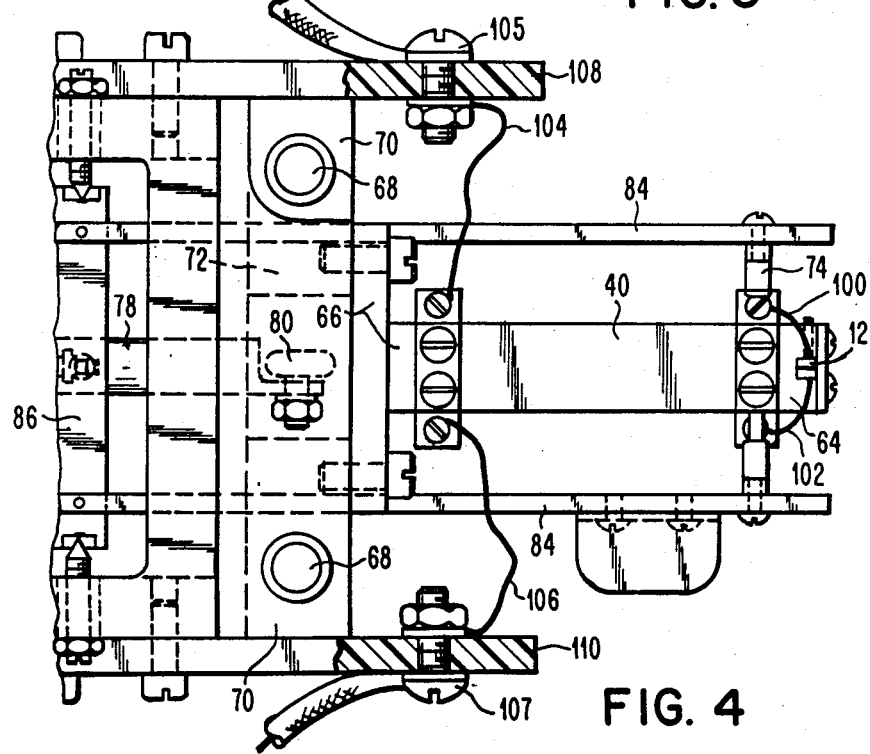
FIG. 4 is a top plan view in the broken section of the structure illustrated in FIG. 3.

The conductive tip members 32 and 34 are each in contact with conductive electrodes, 96 and 98 respectively. Holding screw 99 maintains the tip 12 in contact with the electrodes and also rigid with respect to block 64. A first lead 100 connects electrode 98 to leaf spring 42, and a second lead 102 connects electrode 96 to leaf spring 40. Referring now to FIG. 4, there is illustrated lead 104 connecting spring of 40 to lead terminal 105 mounted on plate 108 which is made of insulating material. In light manner lead 106 connects spring 40 to terminal 107 mounted on plate 110. The terminals 105 and 107 are connected to a suitable power source that produces the appropriate amperage for producing a weld.

Figure 3:
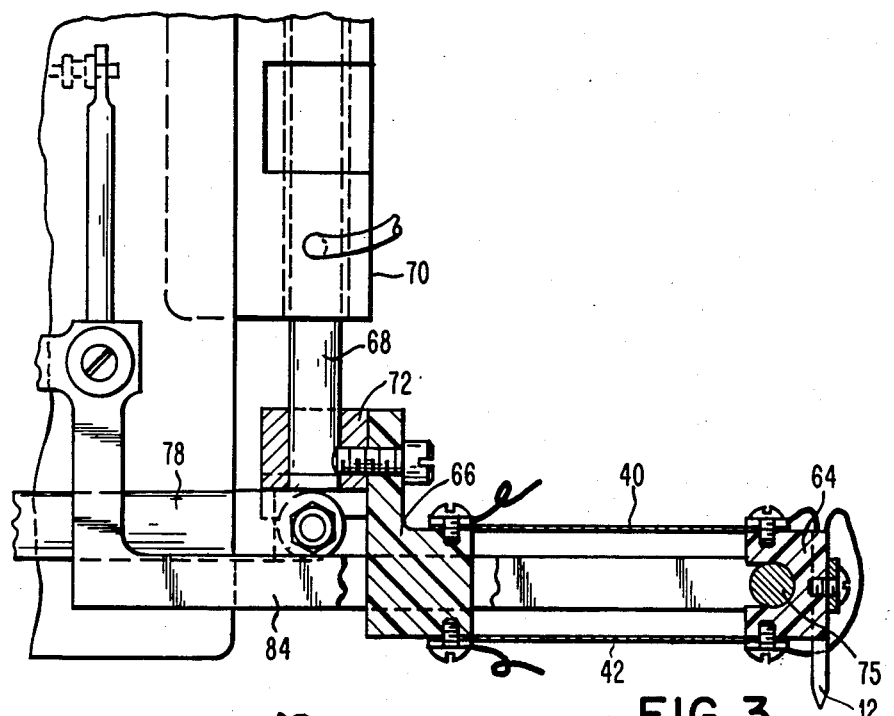
FIG. 3 is a side elevational view, in broken section and in enlarged scale, of the apparatus of this invention illustrating the detail of the welding tip support mechanism.

Referring now to FIGS. 5A and 5B there is illustrated the configuration of a welding tip known to the prior art and the cross-sectional configuration of the wire being bonded before and after the weld has been completed. The welding tip is made up of a pair of juxtaposed electrically conducting tip members 18 and 20, each having a flat surface 19 and 21, respectively, that make contact with wire 22 during the welding operation. As indicated tip members 18 and 20 are spaced from each other. The spacing is maintained by a thin layer of dielectrical material 23. The lower portion of the dielectrical layer 23 is exposed to high temperatures and is rapidly eroded away during operation leaving a space 24. When the tip members 18 and 20 are placed in contact with the wire 22, a low voltage, high amperage, current is cause to flow from one tip member to another through the small segment of wire 22 in contact with the tip members. This causes the wire segment to melt and fuse to the surface of the underlying metal pad 26. When the wire is melted it reforms flowing upwardly in space 24 as indicated in 3B. When the current pulse is over the wire solidifies in the shape shown in FIG. 3B. It is known that small diameter wires can be welded to relatively thin metal compact pads.

Referring now to FIGS. 6A and 6B there is illustrated the cross-sectional configurations of a wire before and after it has been bonded by the apparatus and method of the invention. The welding tip 30 has two electrically conducting tip members 32 and 34 that are spaced and electrically isolated by a layer of dielectric material, 37, typically glass. The bottom surfaces 33 and 35, that make electrical contact with the wire 22, form a pair of upwardly inclined, intersecting planes. The angle of inclination of the plane from the horizontal is in the range of 15 to 20 degrees. This tip configuration performs the function of centering the wire 22 when the tip 30 is brought down in to contact with the wire in preparation for welding. The spacing 36 between tip members 32 and 34 is considerably smaller than the spacing between tip members of the bonding tip of the prior art. The spacing of tip members 32 and 34 is generally in the range of 8 to 13 microns, more specifically from 9 to 11 microns. The dielectric layer in use is eroded back from the surfaces 32 and 35. However, with a smaller spacing between the tip members, the metal of wire 22 has less tendency to flow between the tip members during the welding operation. This is illustrated in the cross-section of welded wire 22 in FIG. 4B.

In the welding operation of the invention the substrate support platform 16 is moved to locate the tip of the probe directly over the pad on substrate 14 on which a wire is to be bonded. A wire 22 is positioned over the metal pad 26 with a suitable position apparatus and the welding assembly 10 lowered until the welding tip 12 contacts the wire 22. The assembly is lowered further as a light pressure is placed on the wire by the welding tip 30, to establish a good electric contact by activating cylinder 94 as described previously. The spring elements 40 and 42, described previously, flex to allow downward movement of the assembly 10. At this point the wire is in position to be welded with the surfaces 33 and 35 of welding tip 30 in electrical contact with the wire. A suitable pulse of electrical current is cause to flow from the tip members 32 and 34 through the wire segment of wire 22. Any suitable current pulse to produce a microweld that is compatible with the wire size and materials of the wire and pad can be used. Typically a current of 50 to 60 amperes can be produced with a voltage of one volt. The current pulse lasts typically about 4 milliseconds. When the wire is heated to its melting point it will very quickly flatten out. An important feature of this apparatus and method is the low mass of the welding tip and holder 64 which allows the tip member surfaces to drop and follow the surface of the molten metal as it partially melts and flattens. This assures that electrical contact is maintained for the remainder of the current pulse, and that a slight pressure is maintained to hold the partially molten wire into contact with the metal pad surfaces that is to be bonded to the wire. As shown in FIG. 7, the pressure applied by the welding tip 30 with wire contacting surfaces that are inclined forces a portion of the wire toward the wire lead 22 forming a slight bulged 23. This bulge makes the wire bond stronger. The wire contacting surfaces of the welding tip 30 can be inclined by either (1) mounting the tip 30 on the assembly, with the intersection of the surfaces perpendicular to the longitudinal axis of the tip, in an inclined position, or (2) mounting the tip in a vertical position but machining the wire contacting surfaces so that they are inclined relative to a wire on the pad. Preferably the line formed by the intersection of surfaces 33 and 35 is inclined from 5 to 10 degrees from the longitudinal axis of a wire positioned on pad 26.

FIG. 8 illustrates a preferred embodiment of the contact surfaces of a welding tip 40 of the invention. Welding tip 40, formed of two juxtaposed tip members 52 and 54, separated by a thin layer of glass 41 has two sets of intersecting inclined surfaces 46 and 47 and 48 and 49. The lines formed by the intersection of these pairs of plane surfaces are inclined upwardly from a central line that is normal to the longitudinal axis of the welding tip 40. The advantage of the surface configuration of welding tip 40 is that the wire 22 can lead from either direction from the tip. In automated welding apparatus with an automatic wire positioning mechanism, the wire may go off the pad in either direction. The inclined surfaces will produce a bulge 23 in the wire adjacent the tip in either direction.

Referring now to FIG. 9 there is illustrated another embodiment of a welding tip of the invention. Welding tip 50 formed of two juxtaposed tip members 52' and 54', separated by a thin layer of glass 56, has two sets of intersecting inclined planes 46, 47 and 48, 49.

These contact surfaces perform the same function as described with respect to welding tip 30. The difference between welding tip 50 shown in FIG. 9, and welding tip 40, is that the welding tip members are separated from each other by a glass layer arranged in a different plane. In the welding tip 50, pressure against the wire will not have the tendency to cause separation of the tip members. Also, the current in welding tip 50 flows longitudinally relative to the axis of the wire during bonding, whereas in welding tip 40 the current flows orthogonally to the axis of the wire.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

I claim:

1. In a welding apparatus for bonding wire with a diameter less than 3 mil to a conductive metal surface wherein an electric current is passed through a portion of the wire in contact with a welding tip, the improvement comprising a welding tip support means for supporting said welding tip for rectilinear vertical movement, the portion of said tip support means that moves with and physically supports the welding tip having a movable mass less than 10 grams which is thereby capable of rapid movement necessary to maintain electrical contact between said welding tip and said wire portion during the molten phase of the wire during the welding operation, said welding tip support means including at least two parallel leaf springs, each with one end fixed to said apparatus, and the other end fixed to said welding tip, and a means to urge said welding tip support means into engagement with said wire on said metal surface.

2. The welding apparatus of claim 1 wherein said welding tip is comprised of two juxtaposed tapered electrodes electrically isolated from each other by a thin layer of inorganic dielectric material bonded to said electrodes, the end surfaces of said welding tip for contact with said wire collectively defined as a pair of upwardly inclined planes that intersect in the center of said welding tip, thereby providing a wire centering function.

3. The welding apparatus of claim 1 wherein said welding tip support means includes a slidably mounted vertical shaft, a flexible welding tip support means fixed to said shaft, and a welding tip fixture holding said welding tip.

4. The welding apparatus of claim 3 wherein said welding tip support means further includes a pivoted balanced arm for supporting said welding tip support means.

5. The welding apparatus of claim 4 wherein said pivoted balanced arm includes a movable weight.

6. The welding apparatus of claim 5 wherein said welding tip support means includes at least two parallel leaf springs each with one end fixed to said vertical shaft, and the other end fixed to said welding tip fixture.

7. The welding apparatus of claim 3 wherein said vertically mounted shaft is supported on air-bearings.

8. The welding apparatus of claim 1 which further includes means for electrically isolating said leaf springs.

9. The welding apparatus of claim 1 wherein said means to urge said welding tip support means into engagement with the wire is comprised of at least one pivoted lever, one end of said pivoted lever being in engagement with said welding tip fixture, a means to urge said one end of said lever downwardly.

10. The welding apparatus of claim 9 wherein said means to urge said lever end is a piston-cylinder operatively engaging said lever.

11. The welding apparatus of claim 10 wherein said lever includes an adjustable balance weight.

12. In a welding apparatus for bonding wire with a diameter less than 3 mil to a conductive metal surface wherein a current is passed through a portion of the wire in contact with the welding tip, the improvement comprising a welding tip support means for supporting said welding tip for rectilinear vertical movement, the portion of said tip support means that moves with and physically supports the welding tip having a movable mask less than 10 grams which is thereby capable of rapid movement necessary to maintain electrical contact between said welding tip and said wire portion during the moltent phase of the wire during the welding operation, said welding tip comprised of two juxtaposed tapered electrodes electrically isolated from each other by a thin layer of inorganic dielectric material bonded to said electrodes, the end surfaces of said welding tip for contact with said wire collectively defined as a pair of upwardly inclined planes that intersect in the center of said welding tip, thereby providing a wire sintering function, said line of intersection of said inclined planes being inclined upwardly relative to the longitudinal axis of said wire being bonded, and means to urge said welding tip support means into engagement with said wire on said metal surface.

13. The welding apparatus of claim 12 wherein said planes are inclined from 15 to 20 degrees upwardly measured from a horizontal plane transverse to the longitudinal axis of the wire being bonded.

14. The welding apparatus of claim 13 wherein said line of intersection of said inclined planes is inclined from 5 to 10 degrees upwardly relative to the longitudinal axis of the wire being bonded.

15. The welding apparatus of claim 12 wherein each of said inclined plane surfaces is formed on each of said electrodes.

16. The welding apparatus of claim 15 wherein said layer of inorganic dielectric material separating said electrodes has a thickness in the range of 8 to 13 microns.

17. The welding apparatus of claim 16 wherein said layer of dielectric material is glass material.

18. The welding apparatus of claim 12, wherein said welding tip has two sets of pairs of upwardly inclined planes where the intersection of said pairs of planes diverge upwardly from the longitudinal axis of a wire being bonded.

19. The welding apparatus of claim 12, wherein said electrodes are formed of tungsten.

* * * * *